(12) United States Patent
Ishikawa

(10) Patent No.: US 7,447,032 B2
(45) Date of Patent: Nov. 4, 2008

(54) HEAT SPREADER MODULE AND METHOD OF MANUFACTURING SAME

(75) Inventor: Shuhei Ishikawa, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 42 days.

(21) Appl. No.: 11/515,638

(22) Filed: Sep. 5, 2006

(65) Prior Publication Data

US 2007/0058349 A1 Mar. 15, 2007

(30) Foreign Application Priority Data

Sep. 9, 2005 (JP) .............................. 2005-261977

(51) Int. Cl.
*H05K 7/20* (2006.01)
(52) U.S. Cl. ....................... 361/704; 361/705; 361/706; 361/719; 257/706; 257/712
(58) Field of Classification Search ........................ None
See application file for complete search history.

(56) References Cited

U.S. PATENT DOCUMENTS

| | | | |
|---|---|---|---|
| 4,583,283 A | 4/1986 | Dubois et al. | |
| 5,050,040 A * | 9/1991 | Gondusky et al. | ........... 361/708 |
| 5,291,065 A | 3/1994 | Arai et al. | |
| 5,354,415 A | 10/1994 | Fushii et al. | |
| 5,561,321 A * | 10/1996 | Hirano et al. | ................ 257/700 |
| 5,608,267 A | 3/1997 | Mahulikar et al. | |
| 5,650,663 A | 7/1997 | Parthasarathi | |
| 5,834,840 A | 11/1998 | Robbins et al. | |
| 5,844,310 A | 12/1998 | Okikawa et al. | |
| 6,032,362 A | 3/2000 | Okikawa et al. | |
| 6,110,577 A | 8/2000 | Ishikawa et al. | |
| 6,261,703 B1 | 7/2001 | Sasaki et al. | |
| 6,282,095 B1 | 8/2001 | Houghton et al. | |
| 6,316,826 B1 | 11/2001 | Yamamoto et al. | |
| 6,331,730 B1 | 12/2001 | Terasaki et al. | |
| 6,343,647 B2 | 2/2002 | Kim et al. | |
| 6,451,449 B2 | 9/2002 | Asakura et al. | |
| 6,475,327 B2 | 11/2002 | Tung et al. | |
| 6,507,105 B1 * | 1/2003 | Yamagata et al. | ........... 257/720 |
| 6,579,623 B2 | 6/2003 | Kurihara et al. | |
| 6,663,969 B2 | 12/2003 | Masayuki et al. | |
| 6,690,087 B2 | 2/2004 | Kobayashi et al. | |
| 6,831,351 B2 | 12/2004 | Hirao et al. | |
| 6,846,987 B2 * | 1/2005 | Lucke et al. | ................. 174/541 |
| 6,911,728 B2 * | 6/2005 | Ishikawa et al. | ............. 257/706 |
| 7,032,652 B2 * | 4/2006 | Wang et al. | ............. 165/104.26 |

(Continued)

FOREIGN PATENT DOCUMENTS

DE 103 24 190 1/2005

(Continued)

*Primary Examiner*—Boris Chérvinsky
(74) *Attorney, Agent, or Firm*—Burr & Brown

(57) ABSTRACT

A heat spreader module is composed of a joined assembly, including a plate member, an insulating board disposed on the plate member, and a circuit board disposed on the insulating board. An IC chip is mounted on an upper surface of the joined assembly, or stated otherwise, on an upper surface of the circuit board, with a solder layer interposed therebetween. A heat sink is joined by a solder layer, for example, onto a lower surface of the joined assembly, or stated otherwise, onto a lower surface of the plate member, thereby making up a heat sink module.

13 Claims, 9 Drawing Sheets

U.S. PATENT DOCUMENTS

| | | |
|---|---|---|
| 7,069,645 B2 | 7/2006 | Ishikawa et al. |
| 7,161,807 B2 * | 1/2007 | Ishikawa et al. ............ 361/708 |
| 2001/0052642 A1 | 12/2001 | Wood et al. |
| 2002/0175403 A1 | 11/2002 | Sreeram et al. |
| 2003/0096059 A1 * | 5/2003 | Suzuki et al. ............... 427/282 |
| 2003/0102553 A1 | 6/2003 | Ishikawa et al. |
| 2003/0201530 A1 * | 10/2003 | Kurihara et al. ............. 257/712 |
| 2004/0130018 A1 * | 7/2004 | Sugiyama et al. ........... 257/706 |
| 2004/0191558 A1 | 9/2004 | Ishikawa et al. |
| 2007/0274047 A1 * | 11/2007 | Nagase et al. ............... 361/704 |

FOREIGN PATENT DOCUMENTS

| | | |
|---|---|---|
| GB | 2 382 082 | 5/2003 |
| JP | 2001-007265 A1 | 1/2001 |
| JP | 2001-339022 A1 | 12/2001 |
| JP | 2002-043482 A1 | 2/2002 |
| JP | 2003-055058 | 2/2003 |
| JP | 2003-309232 A1 | 10/2003 |
| JP | 2004-221605 A1 | 8/2004 |
| JP | 2004-303818 A1 | 10/2004 |

* cited by examiner

FIG. 5

|  |  | a | | | b | | | c | | | d | | | e | | | f | |
|---|---|---|---|---|---|---|---|---|---|---|---|---|---|---|---|---|---|---|
|  |  | g | h | i | g | h | i | g | h | i | j | h | i | g | h | i | k | i |
| INVENTIVE EXAMPLE | 1 | AL | 210 | 0.6 | AlN | 180 | 0.635 | AL | 210 | 0.6 | CB | 330 | 2.000 | AL | 210 | 0.6 | 259.8 | 249.4 |
| | 2 | AL | 210 | 0.6 | AlN | 180 | 0.635 | AL | 210 | 0.6 | CB/AL | 350 | 2.000 | AL | 210 | 0.6 | 268.8 | 258.1 |
| | 3 | AL | 210 | 0.6 | AlN | 180 | 0.635 | AL | 210 | 0.6 | CB/AL | 350 | 10.000 | AL | 210 | 0.6 | 321.1 | 308.2 |
| | 4 | AL | 210 | 0.6 | AlN | 180 | 0.635 | AL | 210 | 0.6 | CB/AL | 350 | 1.200 | AL | 210 | 0.6 | 251.0 | 240.9 |
| | 5 | Cu | 390 | 0.3 | SN | 50 | 0.3 | Cu | 390 | 0.3 | CB | 330 | 2.000 | Cu | 390 | 0.3 | 320.6 | 307.8 |
| | 6 | Cu | 390 | 0.3 | SN | 50 | 0.3 | Cu | 390 | 0.3 | CB/Cu | 350 | 2.000 | Cu | 390 | 0.3 | 333.1 | 319.8 |
| | 7 | Cu | 390 | 0.3 | SN | 50 | 0.3 | Cu | 390 | 0.4 | CB/Cu | 350 | 10.000 | Cu | 390 | 0.4 | 346.0 | 332.1 |
| | 8 | Cu | 390 | 0.3 | SN | 50 | 0.3 | Cu | 390 | 0.3 | CB/Cu | 350 | 0.900 | Cu | 390 | 0.3 | 324.3 | 311.3 |
| COMPARATIVE EXAMPLE | 1 | AL | 210 | 0.6 | AlN | 180 | 0.635 | AL | 210 | 0.6 | ABSENCE | 0 | 0.000 | ABSENCE | 0 | 0 | 199.6 | 191.6 |
| | 2 | Cu | 390 | 0.3 | SN | 50 | 0.300 | Cu | 390 | 0.3 | ABSENCE | 0 | 0.000 | ABSENCE | 0 | 0 | 276.7 | 265.6 |
| | 3 | Cu | 390 | 0.3 | SN | 50 | 0.300 | Cu | 390 | 0.3 | CB | 330 | 0.300 | ABSENCE | 0 | 0 | 290.0 | 278.4 |
| | 4 | AL | 210 | 0.6 | AlN | 180 | 0.635 | AL | 210 | 0.3 | CB/AL | 350 | 0.400 | ABSENCE | 0 | 0 | 229.1 | 219.9 |
| | 5 | Cu | 390 | 0.3 | SN | 50 | 0.300 | Cu | 390 | 0.3 | CB/Cu | 350 | 0.200 | ABSENCE | 0 | 0 | 290.0 | 278.4 | a: CIRCUIT BOARD
b: INSULATING BOARD
c: METAL LAYER (UPPER)
d: POROUS SINTERED BODY
e: METAL LAYER (LOWER)
f: JOINED ASSEMBLY g: MATERIAL
h: THERMAL CONDUCTIVITY (W/mK)
i: THICKNESS (mm)
j: COMPOSITION
k: THEORETICAL THERMAL CONDUCTIVITY OF JOINED ASSEMBLY (W/mK)

FIG. 6

| | | JUDGED THERMAL CONDUCTIVITY | JUDGED THERMAL SHOCK RESISTANCE (150 to −65°C) |
|---|---|---|---|
| INVENTIVE EXAMPLE | 1 | ○ | ○ |
| | 2 | ○ | ○ |
| | 3 | ◎ | ◎ |
| | 4 | ○ | ○ |
| | 5 | ◎ | ◎ |
| | 6 | ◎ | ◎ |
| | 7 | ◎ | ◎ |
| | 8 | ◎ | ○ |
| COMPARATIVE EXAMPLE | 1 | × | × |
| | 2 | ○ | × |
| | 3 | ○ | △ |
| | 4 | △ | △ |
| | 5 | ○ | × |

× 169 OR LESS    0–100 HEAT CYCLES  
△ 170–200    101–500 HEAT CYCLES  
○ 201–230    501–1000 HEAT CYCLES  
◎ 230 OR MORE    1001–2000 HEAT CYCLES

FIG. 9A
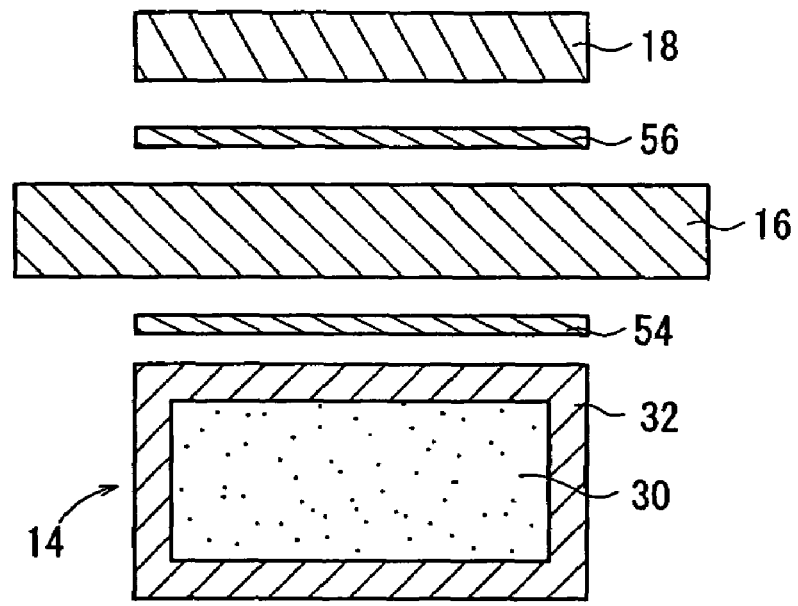
FIG. 9B
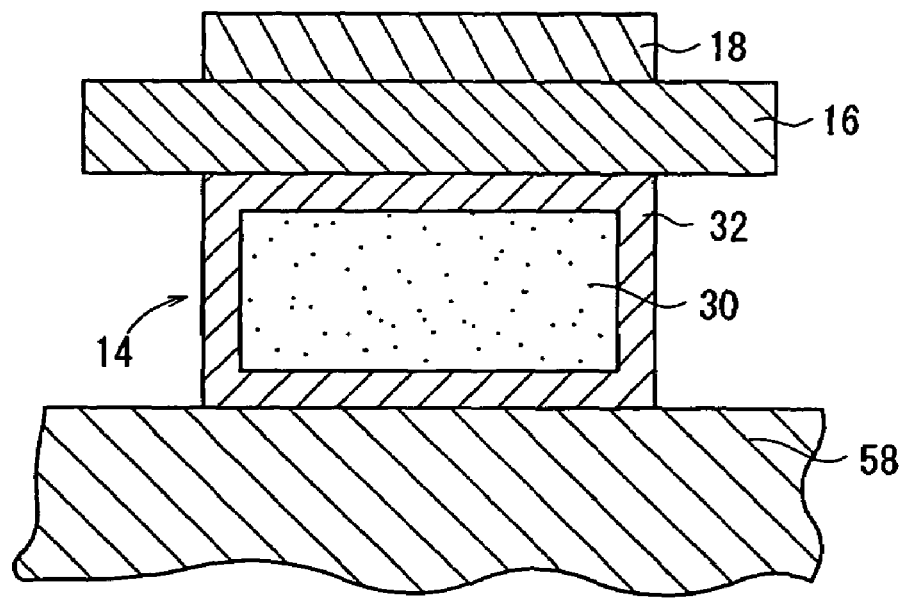

HEAT SPREADER MODULE AND METHOD OF MANUFACTURING SAME

CROSS-REFERENCE TO RELATED APPLICATION

This application is based upon and claims the benefit of priority from Patent Application No. 2005-261977 filed on Sep. 9, 2005, in the Japanese Patent Office, of which the contents are incorporated herein by reference.

BACKGROUND OF THE INVENTION

1. Field of the Invention

The present invention relates to a heat spreader module for cooling an IC chip used in semiconductor devices or the like, and to a method of manufacturing such a heat spreader module.

2. Description of the Related Art

Generally, a heat spreader module for effectively dissipating heat from a semiconductor device, such as an IGBT (Insulated Gate Bipolar Transistor), comprises a circuit board, an insulating board, a metal plate, and a heat spreader (heat diffusion layer). Further, a heat sink is connected to the lower surface of the heat spreader.

Heretofore, it has been widely practiced to join the components of the heat spreader module using a solder layer having a melting point of about 250° C. However, the solder layer poses a large heat transfer resistance, and because two processes are involved in connecting the components, i.e., a process of brazing the circuit board and the insulating board to each other and a process of joining the joined assembly to a base, the manufacturing cost of the heat spreader module is high.

The inventors of the present invention have disclosed in Japanese Laid-Open Patent Publication No. 2002-43482 a process of joining a circuit board, an insulating board, an intermediate layer, and a heat sink using a hard solder material while the components are heated under pressure. According to the disclosed process, the components are joined in one step, without leaving a joined layer that would pose a large heat transfer resistance. The disclosed process makes it possible to produce an inexpensive heat spreader module, which exhibits high thermal conductivity.

The inventors have also proposed a process of manufacturing a heat spreader module having a required bonding strength and without producing excessive hard solder material, together with a heat spreader module manufactured in this manner. For details, see Japanese Laid-Open Patent Publication No. 2004-303818, for example.

If the heat spreader connected to the heat sink is made of CuMo or the like, then the heat spreader needs to be formed into a wide shape in order to spread heat from the semiconductor device over a wide area. If multiple semiconductor devices are mounted on such a wide heat spreader, it is necessary for the semiconductor devices to be installed at spaced intervals. The circuit board, the insulating board, and the metal plate are interposed between the heat spreader and each of the semiconductor devices.

Conventional heat spreader modules are large in size, and the heat spreaders used therein are required to be large in thickness. Consequently, there have been limitations on efforts to reduce the weight, height, size, and cost of such heat spreader modules.

SUMMARY OF THE INVENTION

It is an object of the present invention to provide a heat spreader module, which can be constructed without the need for a conventionally required heat spreader. Thus, the heat spreader module can be reduced in weight, height, size, and cost, while being highly reliable against heat cycles.

Another object of the present invention is to provide a method of easily manufacturing a heat spreader module with increased productivity and yield, wherein the heat spreader module can be reduced in weight, height, size, and cost, and further wherein the heat spreader module exhibits an increase in high thermal conductivity.

The heat spreader module according to the present invention includes a joined assembly including at least a plate member, an insulating board, and a circuit board, which are successively joined together in order, the plate member being formed by a porous sintered body and a metal layer, wherein the porous sintered body is partially or wholly encased by the metal layer.

The plate member functions as a heat spreader, and therefore, the heat spreader module can be constructed without the need for a conventionally required heat spreader. Since a wide plate member is not required, the heat spreader module is reduced in weight, height, size, and cost. Further, since the porous sintered body functions as a stress buffer, the heat spreader module is highly reliable against heat cycles.

In the above structure, the porous sintered body should preferably have a thickness in a range from 30% to 99%, or more preferably in a range from 52% to 91%, of the thickness of the joined assembly.

In the above structure, the metal layer should preferably have a thickness in a range from 0.01% to 50% of the thickness of the joined assembly. As a result of this thickness range, the metal layer is interposed between the insulating board and the porous sintered body, and also between the heat sink (water- or air-cooling fins) joined to the plate member and the porous sintered body, thereby increasing the thermal conductivity of the entire joined assembly overall, while providing a necessary bonding strength between the plate member and the heat sink. The above thickness range is also effective for enabling the porous sintered body to sufficiently reduce stresses produced in the metal layer, thus providing better reliability against heat cycles.

The metal layer has a thickness t1 from the surface of the plate member that is joined to the insulating board to the porous sintered body. The metal layer further has a thickness t2 from another surface of the plate member, which is opposite to the surface of the plate member that is joined to the insulating board, to the porous sintered body. The ratio t1/t2 should preferably be in a range from 0.1 to 10. If the ratio t1/t2 is 1, or is close to 1, the porous sintered body is placed in good balance within the plate member, and warpage of the plate member can easily be controlled, thereby increasing the bonding strength between the plate member and the heat sink.

In the above structure, to provide increased thermal conductivity, the porous sintered body may be impregnated with a metal material, which is the same as the metal material of the metal layer.

Preferably, the porous sintered body is made of carbon, SiC, BeO, BN, AlN, or $Si_3N_4$. Since the porous sintered body exhibits a high thermal conductivity of 300 W/mK or greater, the thermal conductivity of the entire joined assembly overall also becomes high. Furthermore, because the porous sintered body is lighter than a conventional heat spreader fabricated, for example, from CuMo, the weight of the entire joined assembly is prevented from increasing.

In the above structure, the insulating board may be made of AlN (aluminum nitride). Because the thermal conductivity of AlN is high, the entire joined assembly overall also exhibits a high thermal conductivity.

In the above structure, the insulating board may be made of $Si_3N_4$ (silicon nitride). Since $Si_3N_4$ is stronger than AlN, an insulating board made of $Si_3N_4$ may be preferable, if reduction of stress in the plate member tends to be insufficient, depending on the thickness and type of the solder layers used when the IC chip is soldered to the circuit board and the heat sink is soldered to the plate member.

If the insulating board is made of AlN or $Si_3N_4$, then the metal layer may be made of Al (aluminum). Alternatively, if the insulating board is made of $Si_3N_4$, then the metal layer may be made of Cu (copper). If the metal layer is made of Cu, then it is preferable to employ an insulating board made of $Si_3N_4$, since an insulating board made of AlN would not be able to reduce stresses occurring within the plate member.

The circuit board, the insulating board, and the plate member may be integrally combined with each other by means of an insert molding process (first structure). Alternatively, the circuit board and the insulating board may be joined to each other by means of a joining material interposed therebetween, whereas the insulating board and the plate member may also be joined to each other by means of a joining material interposed therebetween (second structure). The first structure is advantageous in that the manufacturing process is simple, since the joined assembly can easily be manufactured according to an insert molding process. However, depending on the materials that are selected, an insert molding process may not be applicable. Thus, the second structure is suitable in cases where an insert molding process cannot be applied.

According to the present invention, there is also provided a method of manufacturing a heat spreader module including a joined assembly made up of at least a plate member, an insulating board, and a circuit board, which are successively joined together in order, wherein the plate member includes a porous sintered body and a metal layer, the porous sintered body being partially or wholly encased by the metal layer, and the method includes the steps of (a) placing the insulating board and the porous sintered body into mold members, (b) pouring molten metal into a cavity defined by the mold members, and (c) cooling the mold members to produce the joined assembly made up of the circuit board, the insulating board, and the plate member, which are integrally combined with each other.

According to the above manufacturing method, a heat spreader module, which is reduced in weight, height, size, and cost, can easily be manufactured. Further, the heat spreader module can be produced with increased productivity and yield. Since no hard solder materials or solder layers need to be interposed between the components of the joined assembly, the heat spreader module exhibits high thermal conductivity.

In the above manufacturing method, the porous sintered body may be impregnated in advance with a metal material, which is the same as the molten metal material. Alternatively, after the insulating board and the porous sintered body have been placed into the mold members, and molten metal is poured into the cavity defined by the mold members, the molten metal may be pressed according to a molten metal forging process or a pressurized casting process.

As described above, the heat spreader module according to the present invention can be constructed without the need for a heat spreader, which has conventionally been required, and thus the heat spreader module can be reduced in weight, height, size, and cost.

The method of manufacturing a heat spreader module according to the present invention makes it possible to easily manufacture the heat spreader module, which is reduced in weight, height, size, and cost, and also to produce heat spreader modules with increased productivity and yield. In addition, the thermal conductivity of the heat spreader module can be increased.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 5 is a table showing details of Inventive Examples 1 through 8, and Comparative Examples 1 through 5, in an experiment conducted for ascertaining both thermal conductivity and thermal shock resistance of the joined assembly;

FIG. 6 is a table showing results of an experiment conducted for ascertaining both thermal conductivity and thermal shock resistance of the joined assembly;

FIG. 9A is a cross-sectional view showing a setting step performed in the second manufacturing method; and FIG. 9B is a cross-sectional view showing a joining step performed in the second manufacturing method.

DESCRIPTION OF THE PREFERRED EMBODIMENTS

A heat spreader module according to the present invention, and a method of manufacturing such a heat spreader module, shall be described below with reference to FIGS. 1 through 9B.

Figure 1:
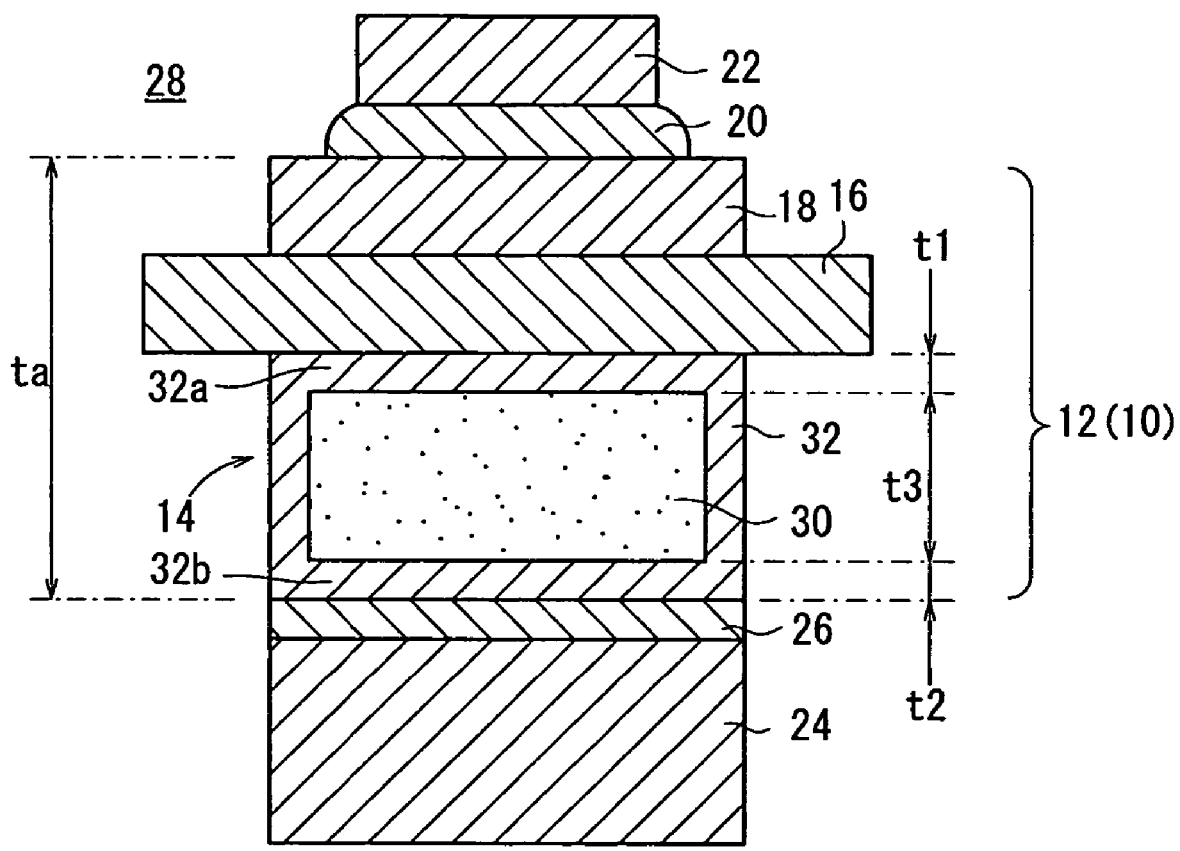
FIG. 1 is a cross-sectional view of a heat spreader module according to an embodiment of the present invention, together with a heat sink module.

As shown in FIG. 1, a heat spreader module 10 according to the present invention comprises a joined assembly 12 made up of a plate member 14, an insulating board 16 disposed on the plate member 14, and a circuit board 18 disposed on the insulating board 16.

An IC chip 22 is mounted on an upper surface of the joined assembly 12, or in other words, the IC chip 22 is mounted on an upper surface of the circuit board 18, with a solder layer 20 interposed therebetween. A heat sink 24, such as water- or air-cooling fins, is joined to a lower surface of the joined assembly 12. Stated otherwise, the heat sink 24 is joined to a lower surface of the plate member 14, through a grease layer and a solder layer 26. The joined assembly 12, the IC chip 22 mounted on the joined assembly 12, and the heat sink 24 mounted on the joined assembly 12, collectively make up the heat sink module 28.

Figure 2:
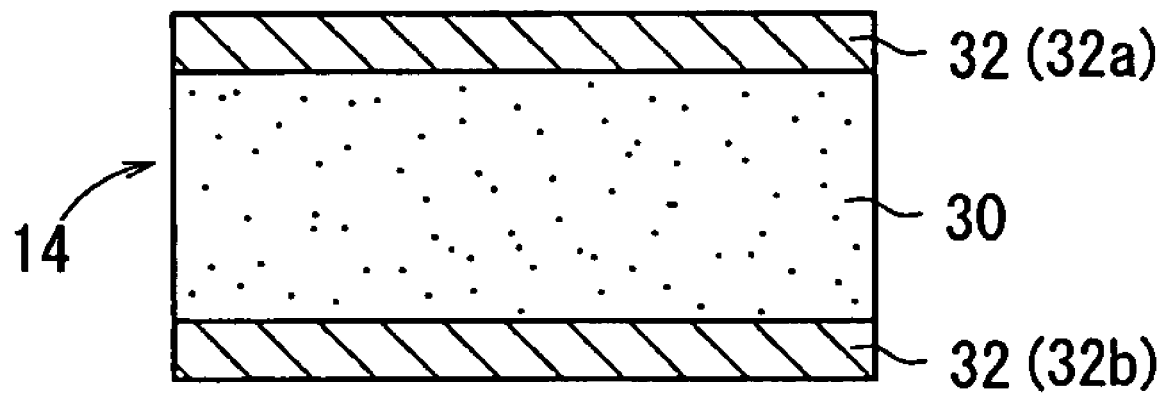
FIG. 2 is a cross-sectional view of a modified plate member.

The plate member 14 includes a porous sintered body 30 and a metal layer 32, wherein the porous sintered body 30 is partially or wholly encased by the metal layer 32. According to the embodiment shown in FIG. 1, the porous sintered body 30 is wholly encased by the metal layer 32. According to a modification, as shown in FIG. 2, the metal layer 32 may be disposed on upper and lower surfaces of the porous sintered body 30, leaving the side faces thereof exposed. Therefore, the metal layer 32 may be present on each of upper and lower portions of the porous sintered body 30.

In the following description, a portion of the metal layer 32 that is present on the upper portion of the porous sintered body 30 shall be referred to as an upper metal layer 32a, and the portion thereof that is present on the lower portion of the porous sintered body 30 shall be referred to as a lower metal layer 32b.

Figure 3:
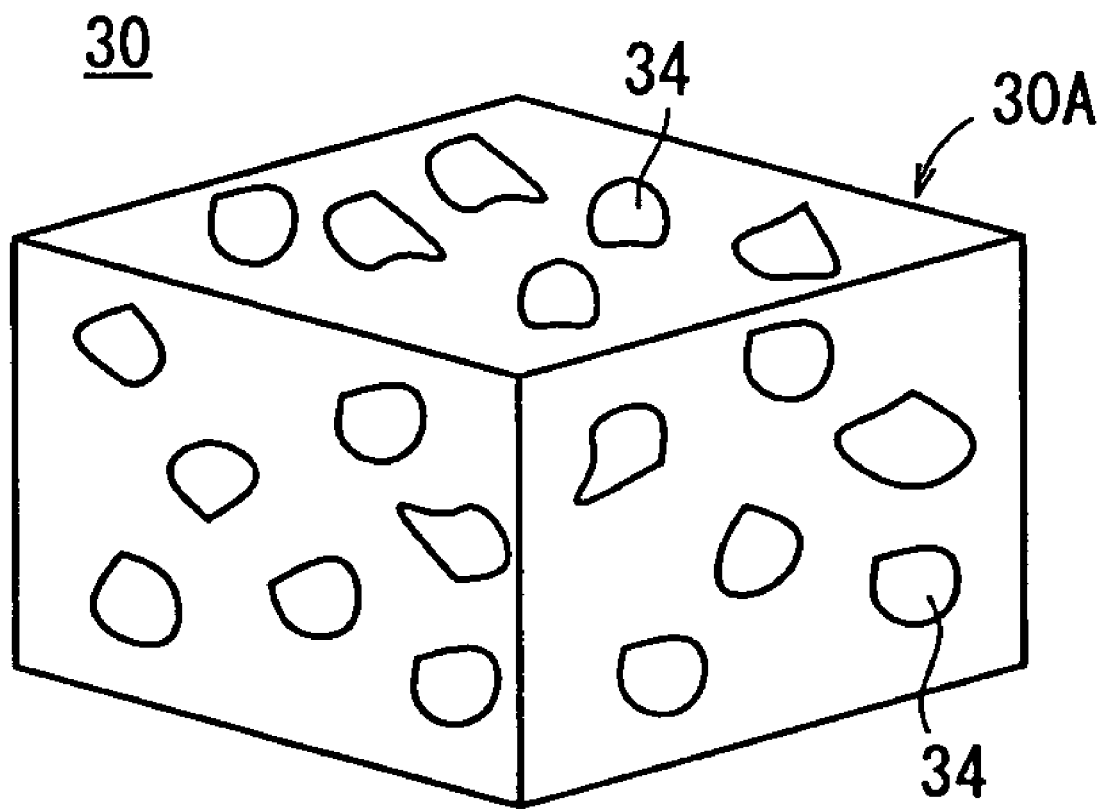
FIG. 3 is a perspective view of a porous sintered body.
Figure 4:
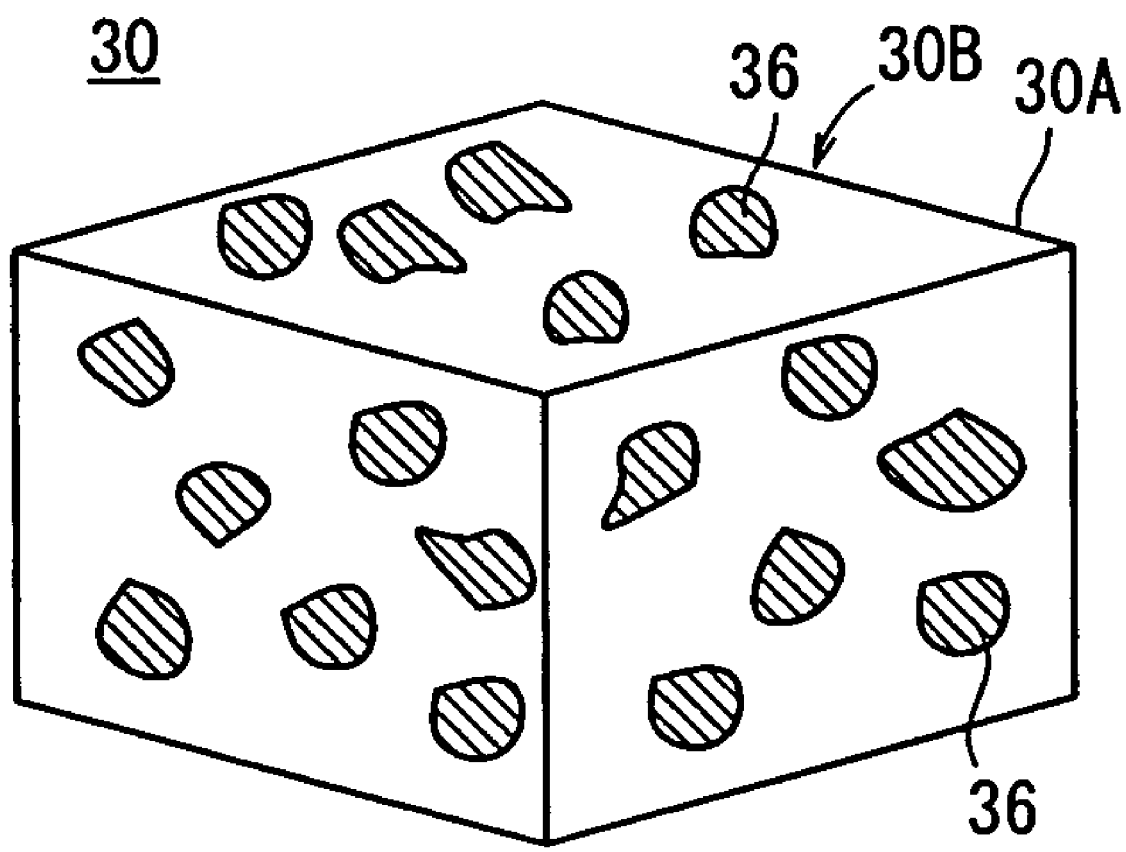
FIG. 4 is a perspective view of another porous sintered body.

As shown in FIG. 3, the porous sintered body 30 may comprise a porous sintered body (carbon, SiC, BeO, BN, AlN, $Si_3N_4$, or the like) 30A, which is in the form of a carbon network produced by prebaking carbon, and wherein the porous sintered body 30A includes a number of pores 34 therein. Alternatively, as shown in FIG. 4, the porous sintered body 30 may comprise a porous sintered body 30B, produced by impregnating pores 34 of the porous sintered body (carbon, SiC, BeO, BN, AlN, $Si_3N_4$, or the like) 30A with a metal material 36, which is the same material as the metal layer 32. To produce the porous sintered body 30B, the porous sintered body 30 may be impregnated with the metal material at the same time that the joined assembly 12 shown in FIG. 12 is produced.

The insulating board 16 may be made of AlN or $Si_3N_4$. The metal material of the metal layer 32 of the plate member 14 may be Al (aluminum) or Cu (copper).

In the heat spreader module 10 according to the present embodiment, the plate member 14 functions as a heat spreader. Therefore, the heat spreader module 10 can be constructed without the need for a heat spreader, as has conventionally been required. Since the plate member 14 is not required to be wide, both the heat spreader module 10 and the heat sink module 28 can be reduced in weight, height, size, and cost. Further, since the porous sintered body 30 functions as a stress buffer, both the heat spreader module 10 and the heat sink module 28 are highly reliable against heat cycles.

Preferred structural details of the plate member 14 shall be described below. The porous sintered body 30 should preferably have a thickness t3, which is in a range from 30% to 99% of the thickness ta of the joined assembly 12. An experiment for verifying the thickness range of the thickness t3 shall be described below. The experiment was conducted based on Inventive Examples 1 through 8, and Comparative Examples 1 through 5, for thereby ascertaining the thermal conductivity and thermal shock resistance of the joined assembly 12. Details of Inventive Examples 1 through 8, and Comparative Examples 1 through 5, are shown in FIG. 5, whereas the results of the experiment are shown in FIG. 6.

In FIG. 6, the thermal conductivity was evaluated as "X" when the thermal conductivity of the joined assembly 12 was 169 W/mK or lower, "Δ" when the thermal conductivity of the joined assembly 12 ranged from 170 to 200 W/mK, "○" when the thermal conductivity of the joined assembly 12 ranged from 201 to 230 W/mK, and "◎" when the thermal conductivity of the joined assembly 12 was 230 W/mK or higher.

In FIG. 6, the thermal shock resistance was evaluated as "X" when a peel-off occurred in the joined assembly 12 after 0 to 100 heat cycles from 150 to −65° C., "Δ" when a peel-off occurred in the joined assembly 12 after 101 to 500 heat cycles from 150 to −65° C., "○" when a peel-off occurred in the joined assembly 12 after 501 to 1000 heat cycles from 150 to −65° C., and "◎" when a peel-off occurred in the joined assembly 12 after 1001 to 2000 heat cycles from 150 to −65° C.

In Inventive Examples 1 through 4, the circuit board 18 was made of Al (aluminum) having a thickness of 0.6 mm, the insulating board 16 was made of AlN (aluminum nitride) having a thickness of 0.635 mm, and the metal layer 32 of the plate member 14 was made of Al. The upper metal layer 32a had a thickness of 0.6 mm, and the lower metal layer 32b had a thickness of 0.6 mm. In Inventive Example 1, the porous sintered body portion 30 of the plate member 14 was made of carbon black (porous sintered body 30A), whereas in Inventive Examples 2 through 4, the porous sintered body 30 was made of carbon black impregnated with Al (porous sintered body 30B). The thickness t3 of the porous sintered body 30 was 2.000 mm in Inventive Examples 1 and 2, 10.000 mm in Inventive Example 3, and 1.200 mm in Inventive Example 4.

In Inventive Examples 5 through 8, the circuit board 18 was made of Cu (copper) having a thickness of 0.3 mm, the insulating board 16 was made of $Si_3N_4$ (silicon nitride, indicated as SN in FIG. 5) having a thickness of 0.300 mm, and the metal layer 32 of the plate member 14 was made of Cu. In Inventive Examples 5, 6, and 8, each of the upper metal layer 32a and the lower metal layer 32b had a thickness of 0.3 mm. In Inventive Example 7, each of the upper metal layer 32a and the lower metal layer 32b had a thickness of 0.4 mm. In Inventive Example 5, the porous sintered body portion 30 of the plate member 14 was made of carbon. In Inventive Examples 6 through 8, the porous sintered body 30 was made of carbon impregnated with Cu. The thickness t3 of the porous sintered body 30 was 2.000 mm in Inventive Examples 5 and 6, 10.000 mm in Inventive Example 7, and 0.900 mm in Inventive Example 8.

In Comparative Examples 1 and 4, the circuit board 18 was made of Al having a thickness of 0.6 mm, the insulating board 16 was made of AlN having a thickness of 0.635 mm, and the metal layer 32 of the plate member 14 (which included only the upper metal layer 32a and was free of the lower metal layer 32b) was made of Al. The thickness of the metal layer 32 was 0.6 mm in Comparative Example 1, and 0.3 mm in Comparative Example 4.

In Comparative Examples 2, 3, and 5, the circuit board 18 was made of Cu having a thickness of 0.3 mm, the insulating board 16 was made of $Si_3N_4$ having a thickness of 0.300 mm, and the metal layer 32 of the plate member 14 (which included only the upper metal layer 32a and was free of the lower metal layer 32b) was made of Cu having a thickness of 0.3 mm.

In each of Comparative Examples 1 and 2, the plate member was free of the porous sintered body 30, and included only the metal layer 32. In Comparative Example 3, the porous sintered body portion 30 of the plate member 14 was made of carbon black. In Comparative Example 4, the porous sintered body portion 30 of the plate member 14 was made of carbon black impregnated with Al. In Comparative Example 5, the porous sintered body portion 30 of the plate member 14 was made of carbon black impregnated with Cu. The thickness t3 of the porous sintered body 30 was 0.300 mm in Comparative Example 3, 0.400 mm in Comparative Example 4, and 0.200 mm in Comparative Example 5.

The ratios of the thickness t3 of the porous sintered body 30 to the thickness ta of the joined assembly 12 were as follows: In Inventive Examples 1 and 2, the thickness t3 of the porous sintered body 30 was 45.1% of the thickness ta of the joined assembly 12. In Inventive Example 3, the thickness t3 of the porous sintered body 30 was 80.4% of the thickness ta of the joined assembly 12. In Inventive Example 4, the thickness t3 of the porous sintered body 30 was 33.0% of the thickness ta of the joined assembly 12. In Inventive Examples 5 and 6, the thickness t3 of the porous sintered body 30 was 62.5% of the thickness ta of the joined assembly 12. In Inventive Example 7, the thickness t3 of the porous sintered body 30 was 87.7% of the thickness ta of the joined assembly 12. In Inventive Example 8, the thickness t3 of the porous sintered body 30 was 42.9% of the thickness ta of the joined assembly 12.

In Comparative Examples 1 and 2, the thickness t3 of the porous sintered body 30 was 0% of the thickness ta of the joined assembly 12. In Comparative Example 3, the thickness t3 of the porous sintered body 30 was 25.0% of the thickness ta of the joined assembly 12. In Comparative Example 4, the thickness t3 of the porous sintered body 30 was 20.7% of the thickness ta of the joined assembly 12. In Comparative Example 5, the thickness t3 of the porous sintered body 30 was 18.2% of the thickness ta of the joined assembly 12.

From the experiment, as shown in FIG. 6, it is apparent that thermal conductivity is poor, and the thermal shock resistance is of low reliability, if the thickness t3 of the porous sintered body 30 is 25% or less of the thickness ta of the joined assembly 12 (Comparative Examples 1 through 5). By contrast, thermal conductivity is good, and the thermal shock resistance is highly reliable, if the thickness t3 of the porous sintered body 30 is 30% or more of the thickness ta of the joined assembly 12 (Inventive Examples 1 through 8).

According to another preferred aspect of the present invention, the thickness of the metal layer 32 (i.e., the thickness of each of the upper metal layer 32a and the lower metal layer 32b) should preferably be in a range from 0.01% to 50% of the thickness ta of the joined assembly 12. When this thickness range is employed, the metal layer 32 is interposed between the insulating board 16 and the porous sintered body 30, as well as between the heat sink 24 (water- or air-cooling fins) joined to the plate member 14 and the porous sintered body 30, thereby increasing the thermal conductivity of the entire joined assembly 12, and providing a necessary bonding strength between the plate member 14 and the heat sink 24. The above thickness range is also effective for enabling the porous sintered body 30 to sufficiently reduce stresses produced in the metal layer 32, and for improving reliability against heat cycles.

If the thickness of the metal layer 32, from the surface of the plate member 14 joined to the insulating board 16 to the porous sintered body 30, is represented by t1, and the thickness of the metal layer 32, from another surface of the plate member 14 that is opposite to the surface of the plate member 14 joined to the insulating board 16 to the porous sintered body 30, is represented by t2, then the ratio t1/t2 should preferably be in the range from 0.1 to 10. If the ratio t1/t2 is 1, or is close to 1, then the porous sintered body 30 is placed in good balance within the plate member 14, and warpage of the plate member 14 can easily be controlled, thereby increasing the bonding strength between the plate member 14 and the heat sink 24.

If the porous sintered body 30 is formed by the porous sintered body 30B, which is produced by impregnating the pores 34 of the porous sintered body 30A with a metal material 36 which is the same material as that of the metal layer 32, as shown in FIG. 4, then thermal conductivity can be increased.

If the porous sintered body 30 is made of carbon, SiC, BeO, BN, AlN, or $Si_3N_4$, then since the porous sintered body 30 has a high thermal conductivity of 300 W/mK or greater, the thermal conductivity of the entire joined assembly 12 overall is also made high. Furthermore, because the porous sintered body 30 is lighter than a conventional heat spreader made of CuMo, for example, the weight of the entire joined assembly 12 overall is prevented from increasing.

If the insulating board 16 is made of AlN, then since the thermal conductivity of AlN is high, the thermal conductivity of the entire joined assembly 12 overall is also made high. Since $Si_3N_4$ is stronger than AlN, an insulating board 16 made of $Si_3N_4$ is preferable if reduction of stress within the plate member 14 tends to be insufficient, depending on the thickness and type of the solder layers 20, 26 used when the IC chip 22 is soldered to the circuit board 18 and the heat sink 24 is soldered to the plate member 14.

If the insulating board 16 is made of AlN or $Si_3N_4$, then the metal layer 32 may be made of Al. Alternatively, if the insulating board 16 is made of $Si_3N_4$, then the metal layer 32 may be made of Cu. If the metal layer 32 is made of Cu, then it is preferable to employ an insulating board 16 made of $Si_3N_4$, since an insulating board 16 made of AlN would not be able to reduce stresses in the plate member 14.

Methods for manufacturing the heat spreader module 10 according to the present embodiment shall be described below with reference to FIGS. 7A through 9B.

Figure 7A:
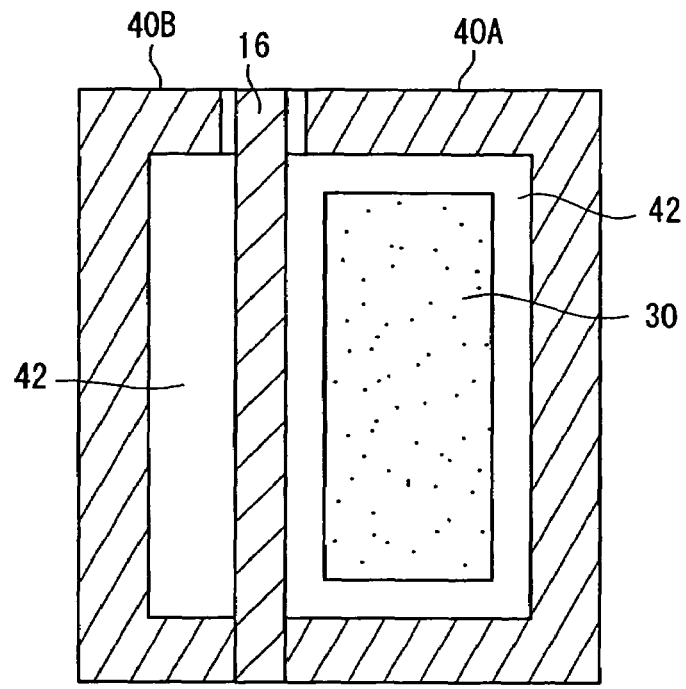
FIG. 7A is a cross-sectional view showing the manner in which an insulating board and a porous sintered body are placed in a mold, in accordance with a first manufacturing method.
Figure 7B:
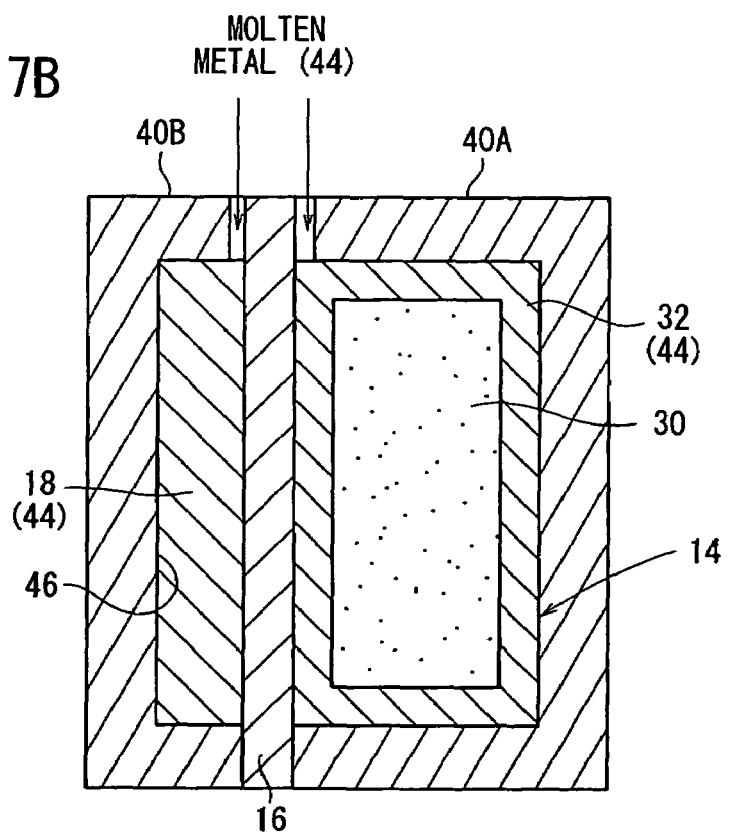
FIG. 7B is a cross-sectional view showing the manner in which molten metal is poured into the cavity of the mold shown in FIG. 7A.

According to a first manufacturing method, as shown in FIG. 7A, the insulating board 16 and the porous sintered body 30 are placed into mold members 40A and 40B, which are used in an insert molding process. Then, as shown in FIG. 7B, a molten metal 44 is poured into a cavity 42 (see FIG. 7A) defined by the mold members 40A, 40B. At this time, the molten metal 44 flows in between an end face of the insulating board 16 and an inner wall surface 46 of the mold member 40A, and also flows in and around the porous sintered body 30. Molten metal 44 that has flowed in between the end face of the insulating board 16 and the inner wall surface 46 of the mold member 40A will subsequently become the circuit board 18. Molten metal 44 that has flowed in and around the porous sintered body 30 will subsequently become the metal layer 32 of the plate member 14.

The mold members 40A, 40B are then cooled and spread apart from each other, thereby producing the joined assembly 12, in which the circuit board 18, the insulating board 16, and the plate member 14 are integrally combined with each other. Thereafter, as shown in FIG. 1, the IC chip 22 is mounted onto the circuit board 18 by the solder layer 20, and the heat sink 24 is joined to the end face of the plate member 14 by the solder layer 26, thus completing the heat sink module 28.

The first manufacturing method is relatively simple because the joined assembly 12 can easily be manufactured according to an insert molding process. The heat spreader module 10, which is reduced in weight, height, size, and cost, can easily be manufactured. Further, the heat spreader module 10 and the heat sink module 28 can be produced with increased productivity and yield. Since no hard solder materials or solder layers need to be interposed between the components of the joined assembly 12, the thermal conductivity of the heat spreader module 10 is high.

Figure 8A:
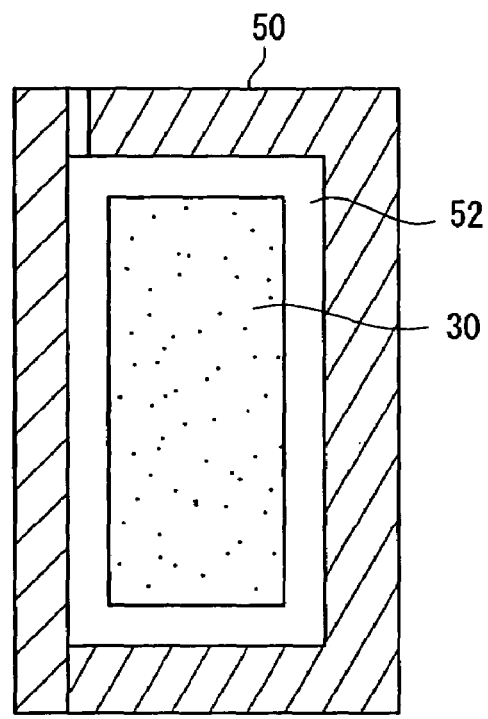
FIG. 8A is a cross-sectional view showing the manner in which a porous sintered body is placed in a mold, in accordance with a second manufacturing method.
Figure 8B:
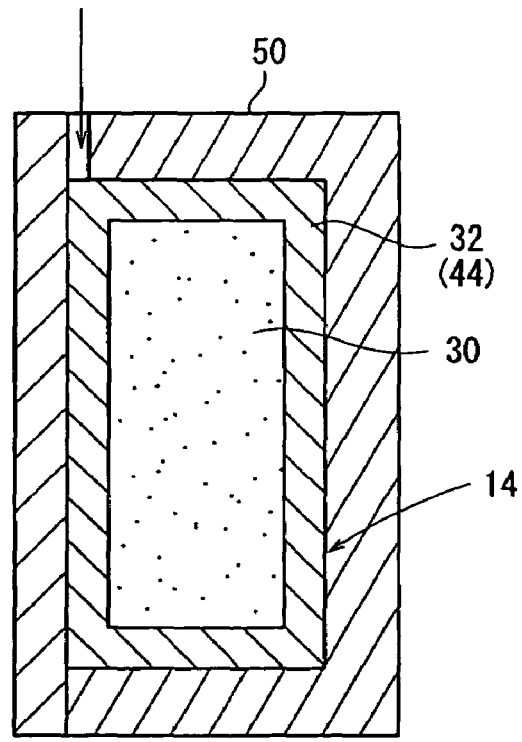
FIG. 8B is a cross-sectional view showing the manner in which molten metal is poured into the cavity of the mold shown in FIG. 8A.

According to a second manufacturing method, as shown in FIG. 8A, the porous sintered body 30 is placed in a mold 50 used in an insert molding process. Then, as shown in FIG. 8B, a molten metal 44 is poured into a cavity 52 (see FIG. 8A)

defined in the mold 50, thereby producing the plate member 14. After the molten metal 44 has been poured into the mold 50, the molten metal 44 may be pressed by a punch or the like, in accordance with a molten metal forging process or a pressure casting process. As the molten metal 44 is pressed, the porous sintered body 30 becomes impregnated with the metal at the same time that the plate member 14 is produced. Therefore, a plate member 14 made up of a composite body in the form of a porous sintered body 30 impregnated with metal, and which is encased by the metal layer 32, can be manufactured at one time.

Thereafter, as shown in FIG. 9A, a hard solder layer 54, the insulating board 16, a hard solder layer 56, and the circuit board 18 are successively set on the plate member 14, while in an atmospheric environment, for example.

Thereafter, as shown in FIG. 9B, the plate member 14, on which the circuit board 18, the hard solder layer 56, the insulating board 16, and the hard solder layer 54 are set, is fixedly mounted on a jig 58. The entire assembly is then pressed downwardly, heated, and cooled in a vacuum of $1.0 \times 10^{-5}$ Torr, thereby joining the circuit board 18 and the insulating board 16 to the plate member 14. The heat spreader module 10, wherein the circuit board 18, the insulating board 16, and the plate member 14 are integrally joined together as shown in FIG. 1, is now completed.

Then, as with the first manufacturing method, the IC chip 22 is mounted on the circuit board 18 by means of the solder layer 20, and the heat sink 24 is joined to the end face of the plate member 14 by means of the solder layer 26, thereby completing the heat sink module 28.

In the second manufacturing method, each of the hard solder materials 54, 56 should preferably contain an active element. The active element may be at least one of elements belonging to group 2A of the periodic table, e.g., Mg, Sr, Ca, Ba, Be, etc., elements belonging to group 3A, e.g., Ce, etc., elements belonging to group 4A, e.g., Ti, Zr, etc., elements belonging to group 5A, e.g., Nb, etc., and elements belonging to group 4B, e.g., B, Si, etc. In the present embodiment, each of the hard solder materials 54, 56 is made up of a hard solder material including Ag, Cu, In and Ti, wherein the active element is Ti.

Depending on the selected materials, an insert molding process may not be applicable, and the second manufacturing method is more suitable in cases where an insert molding process cannot be used.

Although certain preferred embodiments of the present invention have been shown and described in detail, it should be understood that various changes and modifications may be made therein without departing from the scope of the appended claims.

What is claimed is:

1. A heat spreader module comprising:
   a joined assembly comprising a plate member, an insulating board, and a circuit board, which are successively joined together in order,
   wherein said plate member comprises a porous sintered body and a metal layer, said porous sintered body being impregnated with the same material as said metal layer and being partially or wholly encased by said metal layer.

2. A heat spreader module according to claim 1, wherein said porous sintered body has a thickness in a range from 30% to 99% of the thickness of said joined assembly.

3. A heat spreader module according to claim 1, wherein said metal layer has a thickness in a range from 0.01% to 50% of the thickness of said joined assembly.

4. A heat spreader module according to claim 1, wherein said metal layer has a thickness t1 from a surface of said plate member, which is joined to said insulating board, to said porous sintered body, and has a thickness t2 from another surface of said plate member, which is opposite to the surface of the plate member that is joined to said insulating board, to said porous sintered body, wherein a ratio t1/t2 is in a range of 0.1 to 10.

5. A heat spreader module according to claim 1, wherein said porous sintered comprises one of carbon, SiC, BeO, BN, AlN, and $Si_3N_4$.

6. A heat spreader module according to claim 1, wherein said insulating board comprises aluminum nitride.

7. A heat spreader module according to claim 6, wherein said metal layer comprises aluminum or an alloy thereof.

8. A heat spreader module according to claim 1, wherein said insulating board comprises silicon nitride.

9. A heat spreader module according to claim 8, wherein said metal layer comprises aluminum or an alloy thereof.

10. A heat spreader module according to claim 8, wherein said metal layer comprises copper or an alloy thereof.

11. A heat spreader module according to claim 1, wherein said circuit board, said insulating board, and said plate member are integrally combined with each other by an insert molding process.

12. A heat spreader module according to claim 1, wherein said circuit board and said insulating board are joined to each other with a joining material interposed therebetween, and said insulating board and said plate member are joined to each other with a joining material interposed therebetween.

13. A heat spreader module comprising:
    a joined assembly comprising a plate member, an insulating board, and a circuit board, which are successively joined together in order,
    wherein said plate member comprises a porous sintered body and a metal layer, said porous sintered body being impregnated with the same material as said metal layer and being partially or wholly encased by said metal layer, and said metal layer having a thickness of at least 0.3 mm.

* * * * *